United States Patent
Kazan et al.

(10) Patent No.: US 8,005,801 B2
(45) Date of Patent: Aug. 23, 2011

(54) AGING AND COMPRESSING MULTIMEDIA CONTENT

(75) Inventors: Wissam Kazan, Bayada (LB); Adrain Chandley, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 575 days.

(21) Appl. No.: 12/131,143

(22) Filed: Jun. 2, 2008

(65) Prior Publication Data
US 2009/0300015 A1    Dec. 3, 2009

(51) Int. Cl.
*G06F 17/30* (2006.01)
(52) U.S. Cl. ......... 707/693; 707/702; 707/752; 707/821
(58) Field of Classification Search .......... 707/802, 707/693, 702, 752, 821
See application file for complete search history.

(56) References Cited

U.S. PATENT DOCUMENTS

| | | | |
|---|---|---|---|
| 6,111,844 A | 8/2000 | Lacy et al. | |
| 6,317,747 B1 | 11/2001 | Bolan et al. | |
| 6,760,443 B2 | 7/2004 | Lacy et al. | |
| 7,206,453 B2 | 4/2007 | Lee et al. | |
| 7,761,793 B1 * | 7/2010 | Mitchell | 715/277 |
| 2002/0047899 A1 | 4/2002 | Son et al. | |
| 2005/0158038 A1 | 7/2005 | Dettinger et al. | |
| 2005/0271251 A1 | 12/2005 | Russell et al. | |
| 2007/0188600 A1 | 8/2007 | Cooper et al. | |
| 2009/0063561 A1 * | 3/2009 | Sayko et al. | 707/104.1 |

OTHER PUBLICATIONS

"Monkey's Audio Lossless Compressor", http://mp3.radified.com/lossless.htm.
"Encoding Audio and Video with Windows Media Codecs", http://www.microsoft.com/windows/windowsmedia/howto/articles/codecs.aspx.
"Reducing Storage Management Costs via Informed User-Based Policies", http://www.am-utils.org/docs/equota-policy/index.html.

* cited by examiner

*Primary Examiner* — Cheryl Lewis

(57) ABSTRACT

A method and system for optimizing data storage in a storage device. A trigger corresponding to predefined events is received, initiating the optimization of file storage in a storage device. The files are sorted into a list of candidate files according to metadata corresponding to each of the files. A subset of the sorted list of files is selected for compression, based on the position of the candidate files in the sorted list of candidate files. The files comprising the subset of sorted files is compressed by reducing the files in size. The metadata corresponding to the compressed files is updated to reflect the event of the compression.

18 Claims, 4 Drawing Sheets

Basic Computing Device

400

AGING AND COMPRESSING MULTIMEDIA CONTENT

BACKGROUND

Computerized systems have made a significant contribution towards the advancement of modern society and are utilized in a number of applications to achieve advantageous results. The production and storage of multimedia production such as video, audio and imaging is one such example that has benefited from the utilization of computerized systems.

However, as the sophistication of multimedia production devices have increased with industry developments, the quality of production has increased commensurately, and thus greater amounts of resources are necessary to produce, transfer, and store multimedia data. The storage of such multimedia, such as pictures, video, music, among others has become expensive, as demand has grown due to the growing ease at which such content is created. Currently available methods for the efficient storage of media files typically consist of compressing the files according to a data compression algorithm belonging to one of two classes: lossless compression and lossy compression.

Lossless compression schemes retain absolute fidelity of the original data—i.e., data which has been compressed with lossless compression is reversible so that compressed data can be reconstructed in the exact form of the original. Typical lossless compression applications use two different kinds of algorithms: a compression algorithm which generates a statistical model for the input data, and a compression algorithm that then maps the input data to bit sequences using the generated model in such a way that "probable" (e.g. frequently encountered) data will produce shorter output than "improbable" data. Lossless compression is typically used when the precise duplication of the original is of paramount importance, or when the significance of deviation is unknown. Examples where lossless compression techniques are typically applied include executable programs, source code, and text files.

Lossy data compression algorithms do not retain fidelity of the original data and introduce relatively minor differences by accepting some loss of data in order to achieve higher compression. Most lossy compression algorithms allow for variable levels of quality (compression) and as compression is increased, file size is reduced. At the highest compression levels, deterioration becomes noticeable. Lossy compression is most commonly used to compress multimedia data (audio, video, still images), especially in applications such as streaming media and internet telephony. Lossy compression formats suffer from generation loss: repeatedly compressing and decompressing a file will cause the file to progressively lose quality. This is in contrast with lossless data compression, which suffers no loss in quality from successive compressions. The advantage of lossy methods over lossless methods is that in some cases a lossy method can produce a much smaller compressed file than any known lossless method, while still meeting the requirements of the application.

Traditional techniques employed in data storage devices use lossless compression techniques to conserve space taken by older or less-used data. Lossless data compression algorithms will always fail to compress some files, for example any lossless compression algorithm will fail to compress data containing no discernible patterns. Attempts to compress data that has been compressed already will therefore usually result in an expansion, as will attempts to compress encrypted data. Accordingly, these techniques do not work well on popular file formats that already utilize compressions (e.g., .jpg, .mpg, .mp2, .mp3, etc.).

Another technique employed by some online repositories includes a priori restraints on file sizes and/or file types. For example, an online image hosting service may restrict uploaded images to one file format (e.g., .jpg), and subject to strict size restraints. As such, non compliant images (e.g., large images, or images of non-compliant file types) must be individually resized or reformatted before submission. Naturally, when a user of the service has a large amount of images to upload, the process can be extraordinarily inefficient, time-consuming, and user-intensive.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

Embodiments are directed to a file compression system for a storage device. Specifically, a system for compressing data based on use-based metrics to optimize file storage in a storage device. Embodiments address the compression of media types that can be re-rendered to a lower quality to achieve compression while retaining usefulness, but not necessarily fidelity of the result.

In one embodiment, a method is provided to store the files on a disk based on use-based metrics such as file popularity, recent usage, and frequency of usage. Based on the selected heuristic, the file size of the corresponding files will be reduced or maintained. Files on the disk are sorted according to one of the heuristics, and a set of the files under a threshold is selected for compression. The quality of the set of files may be reduced through a lossy compression. Each file also includes metadata that monitors the date of last compression. The sorting algorithm considers the metadata to prevent the same files from being unnecessarily compressed repeatedly.

The method can be triggered to execute based on a different set of heuristics such as a time, remaining capacity of the storage device, or upon a manual trigger. In further embodiments, a user will also be able to set preferences to files the user wishes to remain uncompressed, in which case the algorithm will disregard the file when determining the set of files to compress, and keep the size untouched.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
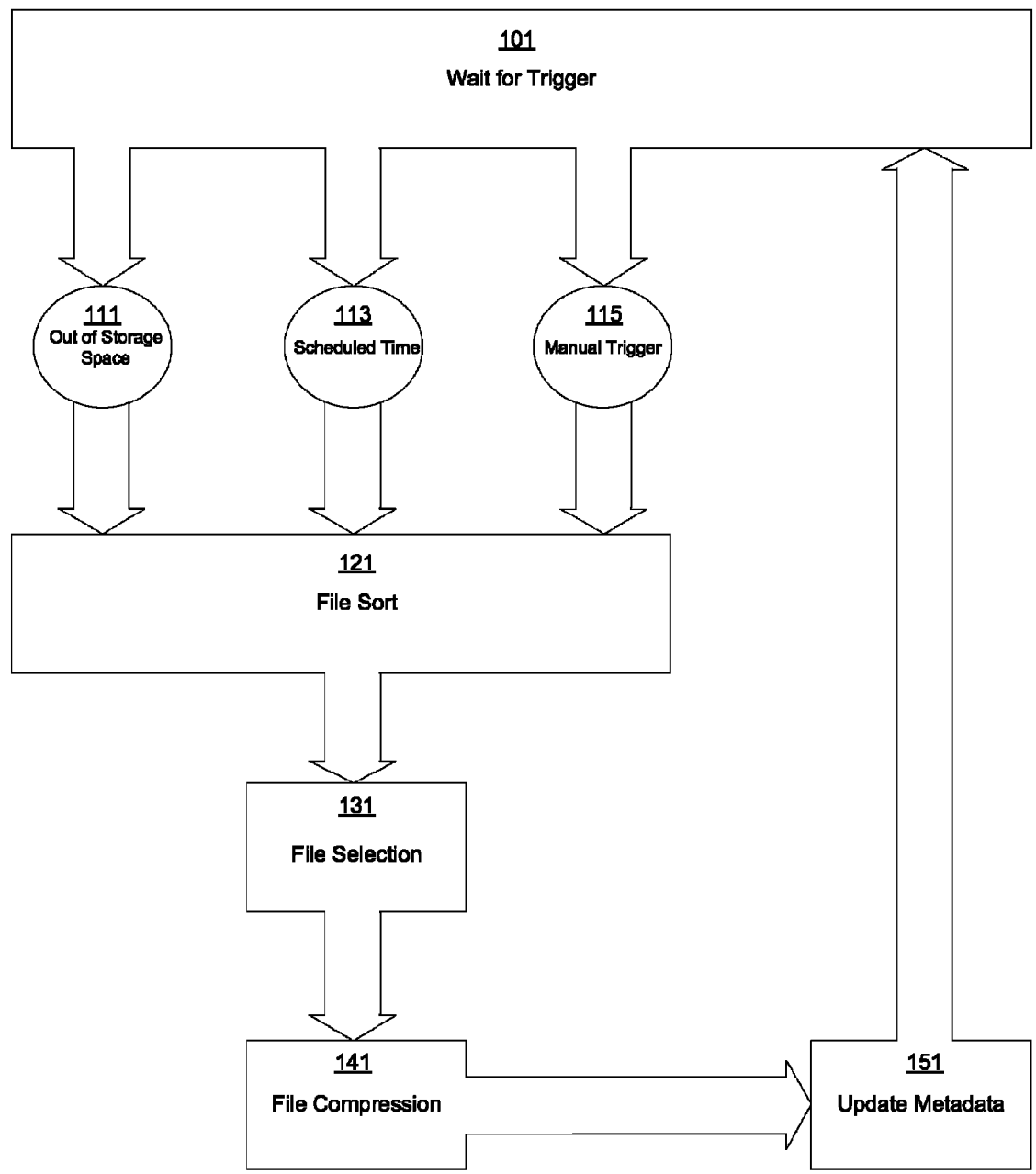
FIG. 1 depicts a state diagram of the states comprising a process for optimizing the storage of data in a storage device in accordance with various embodiments.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 2) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the following embodiments, an approach is described for optimizing data storage in a storage device. This invention proposes a way to optimally store content so that more files can be saved per storage byte by compressing the files through a reduction in quality according to use-based heuristics.

Optimizing Data Storage

With reference now to FIG. 1, a state diagram 100 of the states comprising a process for optimizing the storage of data in a storage device is depicted, in accordance with one embodiment.

State diagram 100 includes waiting state 101, wherein no further steps in the process of optimizing the storage of data until the reception of a trigger event. The trigger event may consist of a set of pre-determined conditions, any one of which has been met. For example, a trigger event may be a time-based trigger 111, capacity based trigger 113 or a manual trigger 115.

Once a trigger event is received, the process proceeds to file sorting state 121, during which files are sorted into a list of candidate files according to pre-selected heuristics to determine the candidate files most eligible for compression. Candidate files most eligible for compression are typically the candidate files which have a low history of usage (according to frequency, recency or popularity heuristics), or the files upon which compression would have the least perceptible impact.

Once the files have been sorted according to candidacy, the process proceeds to file selection state 131, wherein the most eligible candidates within a pre-determined threshold are selected for compression.

Once the files to be compressed are selected, the process proceeds to file compression state 141, wherein the selected files are compressed by reducing the size of the files.

Metadata of the compressed files are updated in update state 151, after which the system returns to waiting state 101 to await the reception of a the next trigger event to initialize the storage optimization process.

Figure 2:
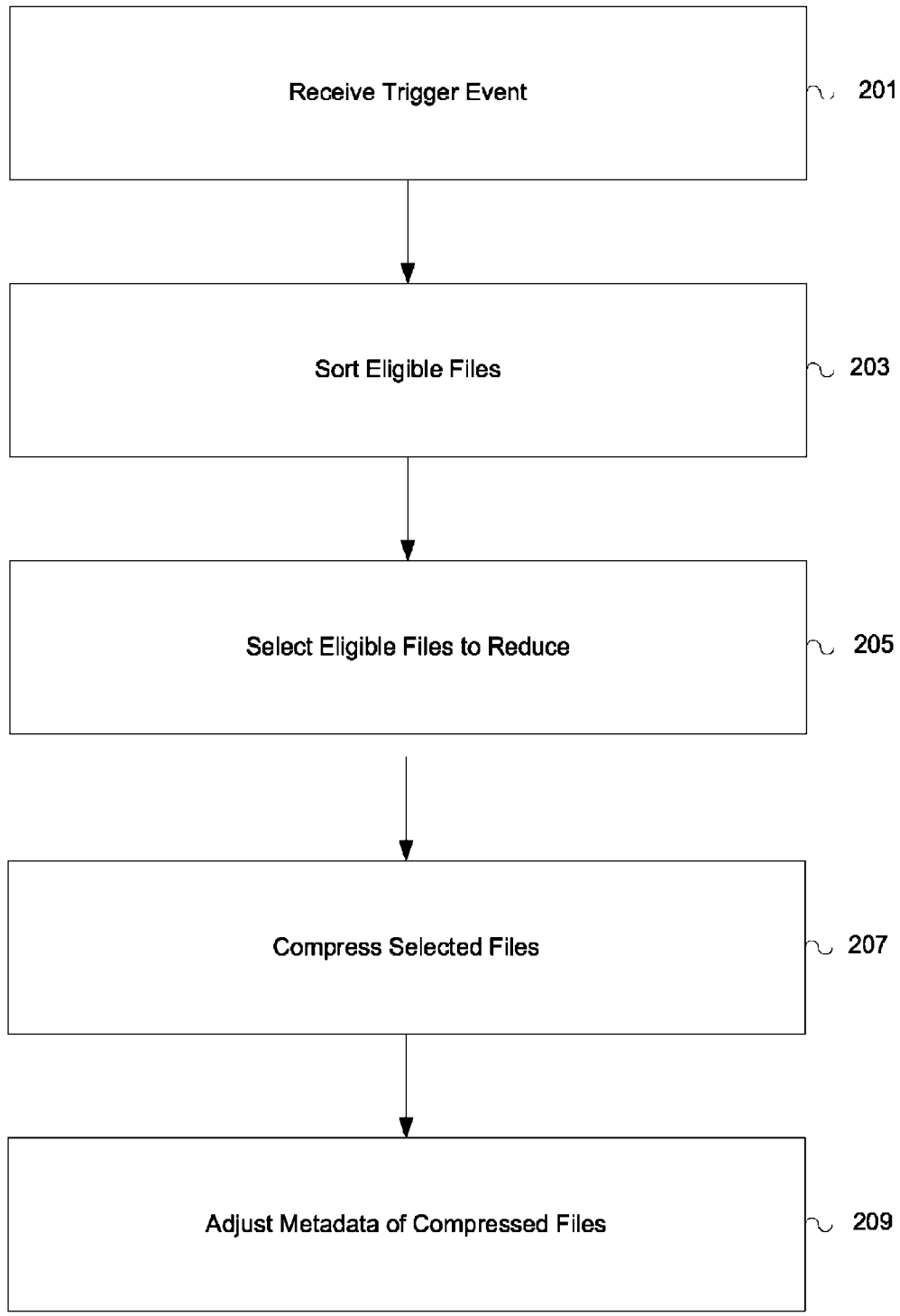
FIG. 2 depicts a flowchart of a method of optimizing the storage of data in a storage device in accordance with various embodiments.

With reference now to FIG. 2, a flowchart 200 of a method of optimizing the storage of data in a storage device is depicted, in accordance with one embodiment.

With reference to step 201, a trigger event notifying the storage device of the need for further storage optimization is received. In one embodiment, the trigger event may be based off periodic scheduling (e.g., every two months), wherein at the end of the scheduled period, the device is triggered to begin the storage optimization process. According to another embodiment, the trigger event may also comprise the achievement of certain storage capacity or quota landmarks. For example, any time the remaining capacity of the storage device reaches a specified level (e.g., twenty percent) or less, the storage device is prompted to optimize its file storage. In a still further embodiment, the trigger event may comprise a manual election, wherein the device proceeds to optimize storage at the user's behest. In other embodiments, the type (e.g., time-based, remaining capacity, manual) of trigger event is configurable according to the user's preferences.

With reference to step 203, once a trigger event is received, the files in the storage device are sorted into a list of candidate files according to metadata corresponding to each of the candidate files to determine the candidate files most eligible for compression. The metadata used in the sort may include compression-based statistics. In one embodiment, the metadata may include the time and date of the last compression for the file. The list may thus be arranged to order the files according to the time and date of the last compression performed on the files (i.e., the files which have been recently compressed would be ordered before the files which have yet to be compressed or which were compressed less recently). In further embodiments, additional sorting techniques may be implemented in the sort to organize the sort according to alternate heuristics, or to accommodate additional heuristics as provided below in FIG. 3.

With reference now to step 205, a subset of files from the sorted list of candidate files arranged in step 203 is selected for compression. In one embodiment, selection of the subset of files consists of the files below a pre-defined threshold in the sorted list. Continuing the previous example, if the threshold used by the storage device was 30%, the files comprising the last 30% of the sorted list would be selected for compression.

With reference to step 207, the files comprising the subset of files selected in step 205 are reduced in size. An appropriate reduction may depend on the type of file compressed. For example, for video files, the file may be compressed by re-encoding the video with a lower bitrate within the same codec, or by compressing the file with a codec with a greater compression rate and/or less preserved fidelity. Audio files may also be compressed by re-encoding the file with a lower bitrate within the same codec, or by re-encoding the file to an alternate file type offering greater compression rates, (e.g., a .wav file may be converted into an .mp3). For image files, images may also be converted to smaller file types (e.g., a bitmap may be converted to a .jpg) or may be resized within the same file format.

While re-encoding a file to an alternate file type with higher compression rates commonly reduces the quality and/or subsequently available functionality, this is not always the case. For example, the audio and video coding standard MPEG-4 may encode a multimedia file which is both higher in quality and smaller in size than the file would be encoded under MPEG-2 (albeit at an increase to processing cost). Accordingly, a reduction in size may correspond with a reduction in quality, but not necessarily so.

In one embodiment, optimizing storage in a storage device may also be applied to document files. Document files may be compressed by re-rendering the files into other file types, typically offering and/or supporting less functionality. However, certain features such as editing, animations, formatting and such may be lost during compression.

In further embodiments, a specific sequence of compression "stages" may be implemented so that the impact to (i.e., deterioration of) the file compressed is minimized during each compression. For example, popular image file sizes include 7.2 megapixels, 5.0 megapixels, 3.0 megapixels, 2.0 megapixels, and 1.0 megapixels. According to this embodiment, each stage of compression would thus consist of a size, so that the aggregation of the stages would encompass the range of popular image sizes. During compression, an image file would thus be resized to the next stage of compression in the sequence. Thus, an image 7.2 megapixels in size would be compressed to 5.0 megapixels. Subsequent compressions would resize the image to (in order) 3.0 megapixels, 2.0 megapixels and finally, 1.0 megapixels, according to the example.

Likewise, audio and video files may be compressed by re-encoding the bitrates according to a series of stages. Industry standards exist for bitrates for both audio and video files according to the intended purpose. Audio files, for example, typically range from 32 kbit per second (AM radio quality) to 320 kbit per second (CD quality), with semi-standard bitrates at 96 kbit/s, 128 kbit/s, 160 kbit/s, 192 kbit/s and 224 kbit/s representing the range of popular audio applications. Similarly, a typical video file under standard MPEG2 compression may vary in bitrate from 16 kbit/s (basic video telephony) to 54 mbit/s (blu-ray dvd), with standard bitrates at 128-384 kbit/s, 1.25 mbit/s, 5 mbit/s, 15 mbit/s and 36 mbit/s, depending on the intended use. Accordingly, each stage of compression would consist of a standard bitrate for each respective media, so that the aggregation of the sequence of stages would encompass the range of popular bitrates, so that each subsequent compression would reduce the size of the file by reducing the bitrate of the file to the next bitrate in the sequence.

In still further embodiments, a user of the storage device may specify the last stage (e.g., bitrate for audio and video files and size for image files) that a file may be compressed to, thus preserving a minimum quality for the file. In one embodiment, the user is able to specify the minimum quality for each file in the storage device. In other embodiments, the user is able to specify the minimum quality for all files of a certain file type (e.g., .jpg). In still further embodiments, the user is able to specify a minimum quality for all files of a certain file type as well as a create exceptions to compress to a minimum quality for specifically designated files. Thus, for example, a user would be able to prohibit compression of all audio files past 128 kbit/s, and would also be able to prohibit compression of a specifically designated audio file past 160 kbit/s. Conversely, the user would also be able to prohibit compression for all audio files past 128 kbit/s, with the exception of one or more specific audio files, which may be compressed further.

With reference to step 209, the metadata corresponding to the candidate files of the files compressed in step 207, and used to sort the files in the storage device in step 203, is adjusted to include and/or reflect the compression. In one embodiment, the metadata is updated to include the time and date of last compression. In other embodiments, the metadata is updated to append the number of compressions which have been performed on the file, and/or the number of remaining compressions which may still be performed on the file, subject to any limitations inherent to the format or placed by the user.

Sorting Candidate Files

Figure 3:
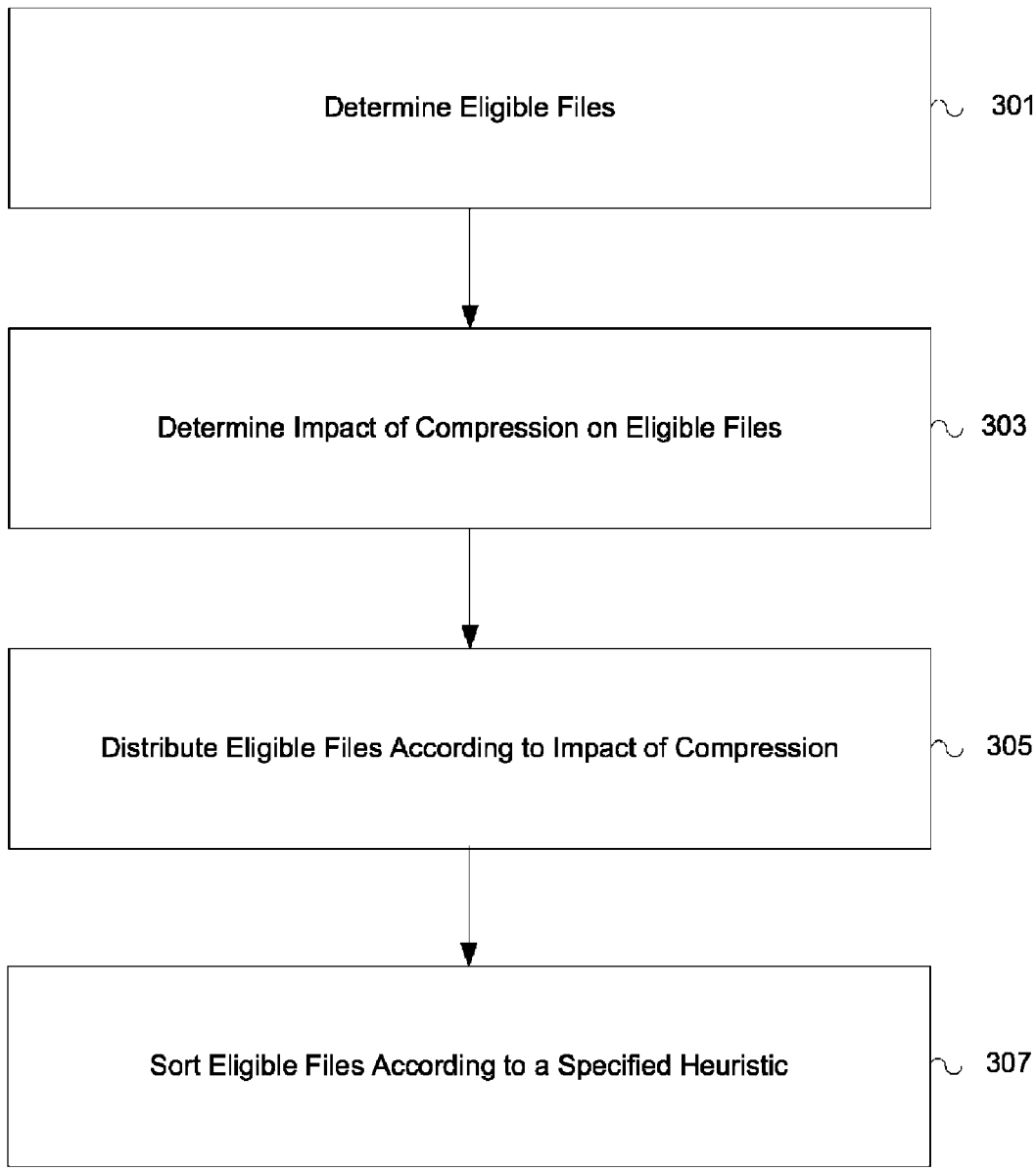
FIG. 3 depicts a flowchart of a method of sorting one or more files as eligible for compression in a storage device in accordance with various embodiments.

With reference now to FIG. 3, a flowchart 300 of a method of sorting one or more files as eligible for compression in a storage device is depicted, in accordance with one embodiment.

With reference to step 301, the files in the storage device eligible for compression is determined. Eligible files may comprise all files within the storage device. In one embodiment, only certain file types may be eligible for compression (e.g., media or document files). In further embodiments, the user may be able to add specific value to a file to exclude a file from compression eligibility. For example, a user may "tag" a file with some designation (e.g., as a "favorite"), which may preclude the file from being eligible for compression. The tag may, for example, be included in the metadata of the file. In embodiments where a user has set a minimum quality for a specific file, or for all files of a file type, files which have been compressed to the minimum quality may also have system-added metadata to preclude the file from being eligible for further compression. During the compression procedure, the metadata of the files are scanned and the files with metadata indicating ineligibility for further compression are no longer considered for compression.

With reference to step 303, the impact of performing a compression on the eligible files in the storage device, as determined in step 301, is determined for each eligible file. In one embodiment, determining the impact of performing a compression may consist of referencing the metadata of the file to determine the number of compressions which have already been performed on the file. Determining the impact of performing a compression may also consist of referencing the metadata of each file to determining the number of compressions which may still be performed on the file, according to file type and user-placed constraints.

Determining the impact of performing a compression estimates the effect of a compression on the remaining quality for the file. In some embodiments, determining the impact of performing a compression on a file may consider the intended use of the file. For example, an image file stored on the hard drive of a computer system may not suffer an appreciable reduction in quality for its intended purpose if the image file is compressed from 7.2 megapixels in size to 5.0 megapixels in size, since computer displays typically have maximum resolutions of around 2 million pixels. Accordingly, an image file being compressed from 2.0 megapixels to 1.0 megapixels in size would have an observable, substantial reduction in perceptible quality. Accordingly, in embodiments where compression follows a sequence of compressions stages, the impact of compression would typically be greater in files which have been compressed repeatedly, and/or of lesser size (image files) or lower bitrate (video and audio files).

With reference to step 305, the eligible files are then sorted according to the respective impact of compression determined in step 303. In one embodiment, eligible files are sorted and grouped with discrete levels of impact. For example, eligible files which would be severely impacted by a subsequent compression would be grouped together, while eligible files which would experience little or no reduction in observable quality (through its intended use) would be grouped together.

With reference to step 307, the eligible files within each group, as distributed in step 305, are further sorted according to a selected heuristic. In one embodiment, the discrete grouping of eligible files is maintained during sorting according to the selected heuristic.

In one embodiment, the selected heuristic considers the metadata of each eligible file, specifically, the metadata regarding the use of the file. For example, metadata corresponding to each eligible file may include data regarding the frequency of use (i.e., how often a user uses, manipulates, or accesses the file), and how recently the file was used, manipulated, or accessed. In some embodiments, the storage device is an online repository that grants access to files to multiple users. In these embodiments, the popularity of the file (i.e., the number of discrete users who use or access the file) may also be included in the metadata of the file.

Heuristics used to sort the eligible files within each discrete grouping may sort the files according to the frequency, recency or popularity of use. In some embodiments, the heuristic is specified by the user. Accordingly, at the conclusion of the sort performed in step 307, eligible files are sorted according to the determined impact of compression, and according to a heuristic based on the history of file usage. Thus, the eligible files are sorted so that files which are accessed infrequently, or have not been accessed for extensive periods of time are distinguished from files with heavy usage, may be considered more appropriate candidates for compression.

Basic Computing Device

Figure 4:
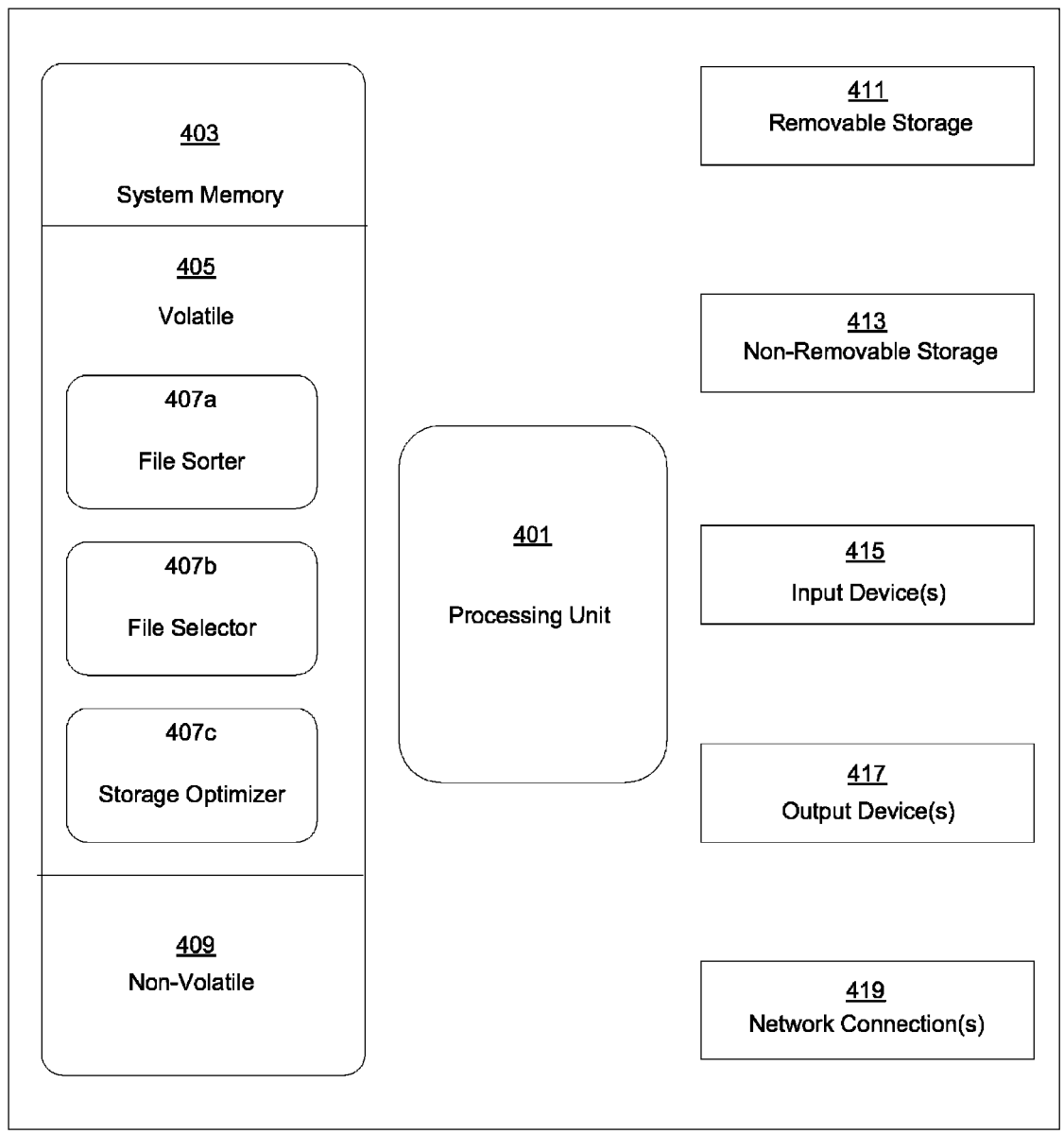
FIG. 4 depicts an exemplary computing device in accordance with various embodiments.

FIG. 4 shows an exemplary computing device 400 according to various embodiments. Computing device 400 depicts the components of a basic computer system providing the execution platform for certain software-based functionality in accordance with various embodiments. Computing device 400 may be the environment upon which the method for optimizing data storage is instantiated, according to various embodiments.

Computing device 400 can be implemented as, for example, a desktop computer system, laptop computer system or server computer system. Similarly, computing device 400 can be implemented as a handheld device (e.g., personal data assistant, digital camera, etc.), a wireless communications device (e.g., cellular phone, pager, etc.), multimedia player (e.g., .mp3 player, portable dvd player), or a device which combines features of one or more of such devices (e.g., a smart phone). Computing device 400 typically includes at least some form of computer readable media. Computer readable media can be a number of different types of available media that can be accessed by computing device 400 and can include, but is not limited to, computer storage media.

In its most basic configuration, computing device 400 typically includes processing unit 401 and memory 403. Depending on the exact configuration and type of computing device 400 that is used, memory 403 can be volatile 405 (such as RAM), non-volatile 409 (such as ROM, flash memory, etc.) or some combination of the two. In one embodiment, file sorter 407a is implemented in volatile memory 405 to generate a sorted list of eligible files from the plurality of files in the storage systems of computing device 400 (e.g., mass storage systems 411 and 413), according to metadata corresponding to the each of the plurality of files. File selector 407b, which selects a subset of files to be compressed from the list of sorted files generated by file sorter 407a according to a predetermined threshold may also be implemented in volatile memory 405a. Storage optimizer 407c, which reduces the size of files in the subset of the sorted list of eligible files may also be implemented in volatile memory 405a.

Additionally, computing device 400 can include mass storage systems (removable 411 and/or non-removable 413) such as magnetic or optical disks or tape. Network reputation service provider 407 and network reputation data source 407a may also be implemented both removable 415 and non-removable 417 mass storage systems. Similarly, computing device 400 can include input devices 419 and/or output devices 421 (e.g., such as a display). Additionally, computing device 400 can include network connections 423 to other devices, computers, networks, servers, etc. using either wired or wireless media. As all of these devices are well known in the art, they need not be discussed in detail.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for optimizing data storage in a storage device, the method comprising:
   receiving a trigger event;
   sorting a plurality of files in the storage device into a sorted list of candidate files according to metadata corresponding to each of the plurality files by applying a sorting algorithm to the candidate files;
   selecting a subset of the one or more candidate files to be compressed based on a position of the candidate files in the sorted list of candidate files,
   compressing files within the subset of candidate files to be compressed; and
   adjusting the metadata corresponding to the candidate files compressed.

2. The method of claim 1, wherein selecting a subset of the files to be compressed further comprises:
   establishing a threshold for candidate files to qualify for compression; and
   identifying a subset of the files in the arranged list that qualify for compression under the threshold established.

3. The method of claim 1, wherein the file is a media file.

4. The method of claim 1, wherein the file is a document file.

5. The method of claim 1, wherein reducing the size of files comprises a lossy compression of the file.

6. The method of claim 5, wherein reducing the size of the files comprises lowering a bitrate of the file.

7. The method of claim 5, wherein reducing the size of the file comprises changing a file type of the file.

8. The method of claim 5, wherein reducing the size of the file comprises applying a different codec to the file.

9. A method for sorting a plurality of files in a storage device as candidates for compression, the method comprising:
  determining eligible files from the plurality of files in the storage device;
  determining a respective impact of compression on the eligible files;
  distributing the eligible files in one or more groups according to the respective impact of compression determined; and
  sorting the files within each group according to a specified heuristic.

10. The method of claim 9, wherein determining a respective impact of compression for each file comprises determining a number of subsequent compressions that may be performed on the file.

11. The method of claim 9, wherein determining a respective impact of compression for each file comprises determining a number of compressions already performed on the file.

12. The method of claim 9, wherein the specified heuristic comprises consideration of meta-data of the files.

13. The method of claim 12, wherein meta-data of a file includes data regarding a history of file usage for the file.

14. A computer system having a memory storing a plurality of files and a processor coupled to the memory, the processor executing computer readable code which implements:
  a file sorter for sorting one or more files into a sorted list of eligible files in response to a received trigger event;
  a file selector for selecting a subset of the sorted list of eligible files to be compressed; and
  a storage optimizer for compressing files in the subset of the sorted list of eligible files.

15. The computer system according to claim 14, wherein the computer system is a wireless communications device.

16. The computer system according to claim 14, wherein the computer system is a hand-held computing device.

17. The computer system according to claim 16, wherein the computer system is a digital camera.

18. The computer system according to claim 16, wherein the computer system is a portable media player.

* * * * *

UNITED STATES PATENT AND TRADEMARK OFFICE
CERTIFICATE OF CORRECTION

| | | |
|---|---|---|
| PATENT NO. | : 8,005,801 B2 | |
| APPLICATION NO. | : 12/131143 | |
| DATED | : August 23, 2011 | |
| INVENTOR(S) | : Wissam Kazam and Adrian Chandley | |

It is certified that error appears in the above-identified patent and that said Letters Patent is hereby corrected as shown below:

On the title page, item (75) Inventors should read:

Wissam Kazam, Bayada (LB); Adrian Chandley, Sammamish, WA (US)

Signed and Sealed this
Twenty-eighth Day of February, 2012

David J. Kappos
*Director of the United States Patent and Trademark Office*